(12) United States Patent
Suzuki

(10) Patent No.: US 8,451,065 B2
(45) Date of Patent: May 28, 2013

(54) OSCILLATOR CIRCUIT AND ELECTRIC-CURRENT CORRECTION METHOD

(75) Inventor: Kouichi Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 77 days.

(21) Appl. No.: 13/333,473

(22) Filed: Dec. 21, 2011

(65) Prior Publication Data

US 2012/0086483 A1    Apr. 12, 2012

Related U.S. Application Data

(63) Continuation of application No. PCT/CT2009/061881, filed on Jun. 29, 2009.

(51) Int. Cl.
*H03L 7/00* (2006.01)

(52) U.S. Cl.
USPC ............... 331/16; 331/17; 331/34; 331/177 R

(58) Field of Classification Search
USPC .................... 331/16, 17, 34, 177 R; 327/156
See application file for complete search history.

(56) References Cited

U.S. PATENT DOCUMENTS

| | | | |
|---|---|---|---|
| 6,111,468 A | 8/2000 | Tanishima | |
| 7,276,977 B2 * | 10/2007 | Self | 331/11 |
| 2003/0048126 A1 | 3/2003 | Watarai | |

FOREIGN PATENT DOCUMENTS

| | | |
|---|---|---|
| JP | 11-225069 | 8/1999 |
| JP | 2000-323985 | 11/2000 |
| JP | 2003-87115 | 3/2003 |
| JP | 2006-270225 | 10/2006 |
| JP | 2008-34926 | 2/2008 |

OTHER PUBLICATIONS

International Search Report for PCT/JP2009/061881 mailed Sep. 8, 2009.

* cited by examiner

*Primary Examiner* — Arnold Kinkead
(74) *Attorney, Agent, or Firm* — Staas & Halsey LLP

(57) ABSTRACT

A PLL circuit includes a storage unit for storing a control voltage at a desired frequency obtained when a reference signal is synchronized with a referenced signal; a current generator circuit that includes a pull-up circuit and a pull-down circuit, each of which outputs an electric current at a predetermined timing; a voltage detecting unit that detects an output voltage corresponding to an electric current output by the current generator circuit; and a current control unit that changes a current value of at least one of the pull-up circuit and the pull-down circuit so that respective current values match each other, and controls the respective current values of the pull-up circuit and the pull-down circuit so that the output voltage detected by the voltage detecting unit matches the control voltage stored in the storage unit.

15 Claims, 13 Drawing Sheets

OSCILLATOR CIRCUIT AND ELECTRIC-CURRENT CORRECTION METHOD

CROSS-REFERENCE TO RELATED APPLICATION

This application is a continuation application of the prior Japanese Patent Application No. PCT/JP2009/061881, filed on Jun. 29, 2009, expired, the entire contents of which are incorporated herein by reference.

FIELD

The embodiments discussed herein are directed to, for example, an oscillator circuit and an electric-current correction method.

BACKGROUND

Conventional Phase Locked Loop (PLL) circuits that are used as phase synchronous circuits and oscillator circuits in transmission devices and server devices receive input of a reference signal with a reference frequency and generate an output signal with a desired frequency that is synchronized or multiplied based on the reference signal.

FIG. 10 is a block diagram of a schematic configuration of the interior of a conventional PLL circuit.

A PLL circuit 100 illustrated in FIG. 10 includes a 1/N frequency divider 101 that divides the frequency of a referenced signal, which is an output signal of the PLL circuit 100 as described below, by N; a phase frequency comparator 102; a charge pump 103; a low-pass filter 104; and a voltage controlled oscillator (hereinafter, described as a "VCO (Voltage Controlled Oscillator)") 105.

The PLL circuit 100 outputs a referenced signal with a desired frequency that is synchronized with a reference signal, on the basis of a phase difference signal.

The phase frequency comparator 102 compares frequencies and phases between the referenced signal whose frequency has been divided by N by the 1/N frequency divider 101 and the reference signal, and outputs a phase difference signal to the charge pump 103 as a result of the comparison. The phase difference signal includes an up signal that is output when the phase of the referenced signal is delayed from the phase of the reference signal, and a down signal that is output when the phase of the referenced signal is advanced from the phase of the reference signal.

When the referenced signal is synchronized with the reference signal, the phase frequency comparator 102 outputs both of the up signal and the down signal to the charge pump 103 in order to prevent the charge pump 103 from becoming a dead zone and unstable.

The charge pump 103 outputs a current pulse to the low-pass filter 104 on the basis of the phase difference signal output by the phase frequency comparator 102. Specifically, the charge pump 103 includes a P-channel transistor (hereinafter, described as a "P channel") and an N-channel transistor (hereinafter, described as an "N channel"). When detecting the up signal, the charge pump 103 outputs a current pulse for flowing out an electric current via the P-channel to the low-pass filter 104, and, when detecting the down signal, the charge pump 103 outputs a current pulse for drawing an electric current via the N channel to the low-pass filter 104.

The low-pass filter 104 outputs a control voltage to the VCO 105 in accordance with the current pulse.

The VCO 105 generates and outputs a referenced signal with a desired frequency in accordance with the control voltage.

It is known that the control voltage used for generating the desired frequency changes with a process variation that occurs due to manufacturing (process) conditions or the like. Examples of the process variation include a variation in device properties of the P channel, the N channel, and the like due to manufacturing conditions or manufacturing environment and a variation due to reduction in a power-supply voltage and the short channel effect in a MOS process.

Therefore, a technology related to a PLL circuit as explained below has been disclosed in order to stabilize the control voltage at the desired frequency. FIG. 11 is a block diagram of a schematic configuration of the interior of a conventional PLL circuit for stabilizing a control voltage. In a PLL circuit 200 illustrated in FIG. 11, a frequency counter 201 monitors a frequency of a reference signal. Furthermore, in the PLL circuit 200, a control unit 202 reads, from a memory 203, a current value corresponding to the frequency of the reference signal that is obtained as a result of the monitoring, and sets the read current value simultaneously to the P channel and the N channel of the charge pump 103 to correct current values.

Patent Literature 1: Japanese Laid-open Patent Publication No. 2008-034926

However, in the conventional PLL circuit, if a process variation occurs, the current value of each of the P channel and the N channel may be deviated from a design value that is a target value (hereinafter, described as a "target design value") even when a referenced signal is synchronized with a reference signal. When a deviation from the target design value occurs, noise or jitter occurs in the control voltage, which is a problem. The jitter indicates a deviation or a variation of the referenced signal over time.

The above problem will be explained below with reference to FIG. 12 and FIG. 13.

FIG. 12A is a diagram illustrating oscillation frequency-control voltage characteristics of the VCO 105. FIG. 12B is a diagram illustrating current-control voltage characteristics of the charge pump 103.

FIG. 12A indicates that the characteristics of the control voltage (the X coordinate) versus the oscillation frequency (the Y coordinate) vary with a process variation. As illustrated in FIG. 12A, control voltages (V1, V2, V3) used to obtain a desired oscillation frequency become different from one another due to variations among three types of processes (a1, a2, a3). Here, it is assumed that a2 represents a typical process condition at the time of design.

FIG. 12B indicates that current values of respective electric currents output from the N channel and the P channel of the charge pump 103 are deviated from each other when the control voltage varies. At the control voltage V2 under the typical process condition a2, a current value Ip of the P channel and a current value In of the N channel match each other at the target design value.

However, if the control voltage decreases because of the process condition a1, the current value Ip of the P channel becomes greater than the target design value and the current value In of the N channel becomes smaller than the target design value. This is because the decrease in the control voltage causes a source-drain voltage to decrease to thereby decrease the current value due to the property of the N channel, and causes a source-drain voltage to increase to thereby increase the current value due to the property of the P channel.

A problem that occurs when the current values of the respective electric currents output from the P channel and the N channel are deviated from each other as described above will be explained below with reference to FIG. 13. It is assumed that a referenced signal is synchronized with a reference signal. FIG. 13(a) is a diagram illustrating a case that respective output currents output from the N channel and the P channel of the charge pump 103 are deviated from each other. FIG. 13(b) is a diagram illustrating an influence on the control voltage. FIG. 13(c) is a diagram illustrating an influence on the reference signal and the referenced signal.

In FIG. 13(a), when the current value Ip of the P channel of the charge pump 103 is greater than the current value In of the N channel, a pulse width wp of the electric current of the P channel is narrower than a pulse width wn of the electric current of the N channel. This is because the low-pass filter 104 sets the pulse widths in accordance with the current values so that the same results can be obtained through integration based on the respective current pulses output from the P channel and the N channel. A1 indicates a current pulse that is obtained when the current value Ip of the P channel and the current value In of the N channel match each other, that is, when, for example, the typical process condition a2 is employed.

FIG. 13(b) illustrates the control voltage at the current pulse illustrated in FIG. 13(a). Because the pulse widths and the current values of respective electric currents output from the N channel and the P channel are different from each other, the control voltage becomes unstable.

FIG. 13(c) illustrates respective phases of the reference signal and the referenced signal at the current pulse illustrated in FIG. 13(a). The current pulse of the P channel rises at the same time when the reference signal rises, so that a stationary phase difference (wn−wp) occurs between the reference signal and the referenced signal.

Therefore, if only one of the current pulses of the P channel and the N channel rises at a timing at which the one of the current pulses of the P channel and the N channel rises, or if amplitudes of current pulses vary even when both of the current pulses rise, the electric currents are not cancelled out, resulting in noise in the control voltage.

Furthermore, the PLL circuit causes a delay time by the stationary phase difference between the reference signal and the referenced signal, so that jitter occurs.

Moreover, the conventional PLL circuit 200 sets a current value simultaneously to the P channel and the N channel to correct current values. Therefore, even when an electric current output from the charge pump 103 is made to pass through a high-load resistance, the current values of respective electric currents output from the P channel and the N channel are deviated from a target design value due to reduction in a power-supply voltage and due to the short channel effect in a MOS process. Therefore, the stationary phase difference occurs by a difference between the current pulse widths, resulting in jitter.

SUMMARY

According to an aspect of an embodiment of the invention, an oscillator circuit includes a storage unit, a current generator circuit, a voltage detecting unit and a current control unit. The storage unit stores therein a control voltage at a desired frequency that is obtained when a reference signal and a referenced signal are synchronized with each other. The current generator circuit includes a pull-up circuit that flows out an electric current at a predetermined timing and a pull-down circuit that draws an electric current at a predetermined timing. The voltage detecting unit detects an output voltage corresponding to an electric current output by the current generator circuit. A current control unit changes a current value of at least one of the pull-up circuit and the pull-down circuit so that respective current values of the pull-up circuit and the pull-down circuit match each other, and controls the respective current values of the pull-up circuit and the pull-down circuit so that the output voltage detected by the voltage detecting unit matches the control voltage stored in the storage unit.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments of an oscillator circuit and an electric-current correction method according to the present invention will be described in detail below with reference to the accompanying drawings. The present invention is not limited by the embodiments.

[a] First Embodiment

Figure 1:
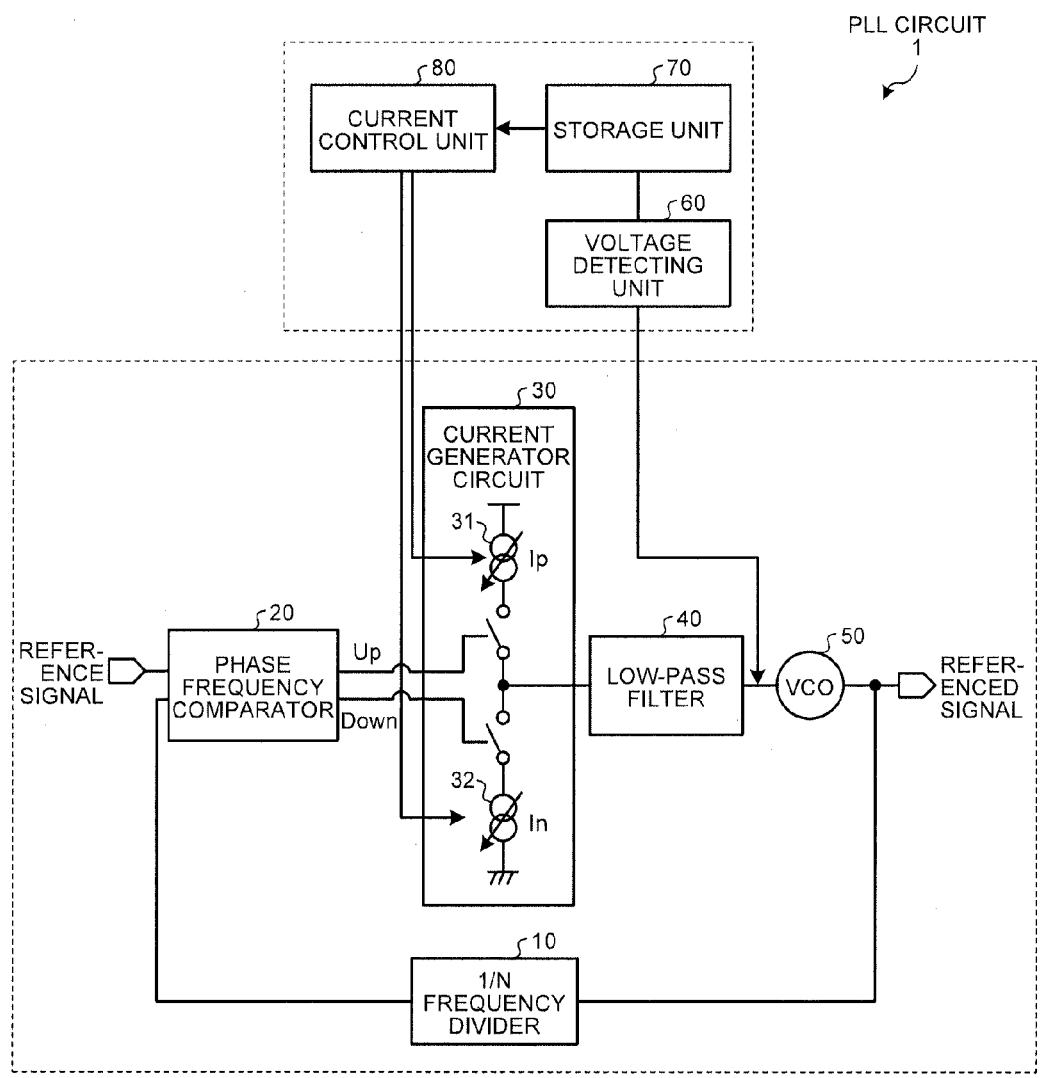
FIG. 1 is a functional block diagram of a configuration of a PLL circuit according to a first embodiment.

FIG. 1 is a functional block diagram of a configuration of a PLL circuit according to a first embodiment. A PLL circuit 1 illustrated in FIG. 1 includes a 1/N frequency divider 10 that divides the frequency of a referenced signal, which is an output signal of the PLL circuit 1, by N; a phase frequency comparator 20; a current generator circuit (hereinafter, described as a "charge pump") 30; a low-pass filter 40; a VCO 50; a voltage detecting unit 60; a storage unit 70; and a current control unit 80.

The PLL circuit 1 outputs a referenced signal with a desired frequency synchronized with a reference signal, on the basis of a phase difference signal.

The phase frequency comparator 20 compares frequencies and phases between the referenced signal whose frequency has been divided by N by the 1/N frequency divider 10 and the reference signal, and outputs a phase difference signal to the charge pump 30 as a result of the comparison. Specifically, the phase frequency comparator 20 outputs an up signal corresponding to a phase difference to the charge pump 30 when the phase of the referenced signal is delayed from the phase of the reference signal. The phase frequency comparator 20 outputs a down signal corresponding to the phase difference to the charge pump 30 when the phase of the referenced signal is advanced from the phase of the reference signal.

When the referenced signal is synchronized with the reference signal, the phase frequency comparator 20 outputs both of the up signal and the down signal based on the synchronization to the charge pump 30 in order to prevent the charge pump 30 from becoming a dead zone and unstable.

The charge pump 30 is constructed of a Complementary Metal Oxide Semiconductor (CMOS) that includes a pull-up circuit, i.e., a P-channel MOSFET (hereinafter, described as a "P channel") 31 that flows out an electric current in accordance with the up signal; and a pull-down circuit, i.e., an N-channel MOSFET (hereinafter, described as an "N channel") 32 that draws an electric current in accordance with the down signal.

When detecting the up signal from the phase frequency comparator 20, the charge pump 30 outputs a current pulse for outputting an electric current via the P channel to the low-pass filter 40 on the basis of the up signal and a current value controlled by the current control unit 80. When detecting the down signal from the phase frequency comparator 20, the charge pump 30 outputs a current pulse for outputting an electric current via the N channel to the low-pass filter 40 on the basis of the down signal and a current value controlled by the current control unit 80.

The low-pass filter 40 outputs a control voltage to the VCO 50 in accordance with the current pulse.

The VCO 50 generates and outputs a referenced signal with a desired frequency in accordance with the control voltage.

The voltage detecting unit 60 is connected between the low-pass filter 40 and the VCO 50 and detects the control voltage output by the low-pass filter 40.

The storage unit 70 stores therein a control voltage at a desired frequency that is obtained at a lock point at which the phases of the reference signal and the referenced signal match each other (hereinafter, this voltage is described as a "lock-point control voltage").

The current control unit 80 changes at least one of the current values of the P channel 31 and the N channel 32 so that the current values match each other. The current control unit 80 then controls the respective current values of the P channel 31 and the N channel 32 so that the control voltage detected by the charge pump 30 matches the lock-point control voltage stored in the storage unit 70.

Therefore, in the PLL circuit 1, when the current values of the P channel 31 and the N channel 32 match each other while the control voltage detected by the voltage detecting unit 60 matches the lock-point control voltage, the widths and the amplitudes of the respective current pulses output from the P channel 31 and the N channel 32 at the lock point match each other. Consequently, the PLL circuit 1 can reduce the stationary phase difference between the reference signal and the referenced signal.

Furthermore, because the widths and the amplitudes of the respective current pulses output from the P channel 31 and the N channel 32 match each other at the lock point in the PLL circuit 1, the PLL circuit 1 can cancel out the electric currents at each timing at which a current pulse rises, so that it is possible to reduce noise in the control voltage.

Moreover, because the PLL circuit 1 can reduce the stationary phase difference, it is possible to reduce a delay time between the reference signal and the referenced signal, enabling to reduce jitter.

In the PLL circuit 1 according to the first embodiment, the current control unit 80 changes at least one of the current values of the P channel 31 and the N channel 32 so that the current values match each other. Thereafter, the PLL circuit 1 controls the respective current values of the P channel 31 and the N channel 32 so that the control voltage detected by the voltage detecting unit 60 matches the lock-point control voltage. However, the embodiments are not limited to the above but include the following configuration, which will be explained below as a second embodiment.

[b] Second Embodiment

Figure 2:
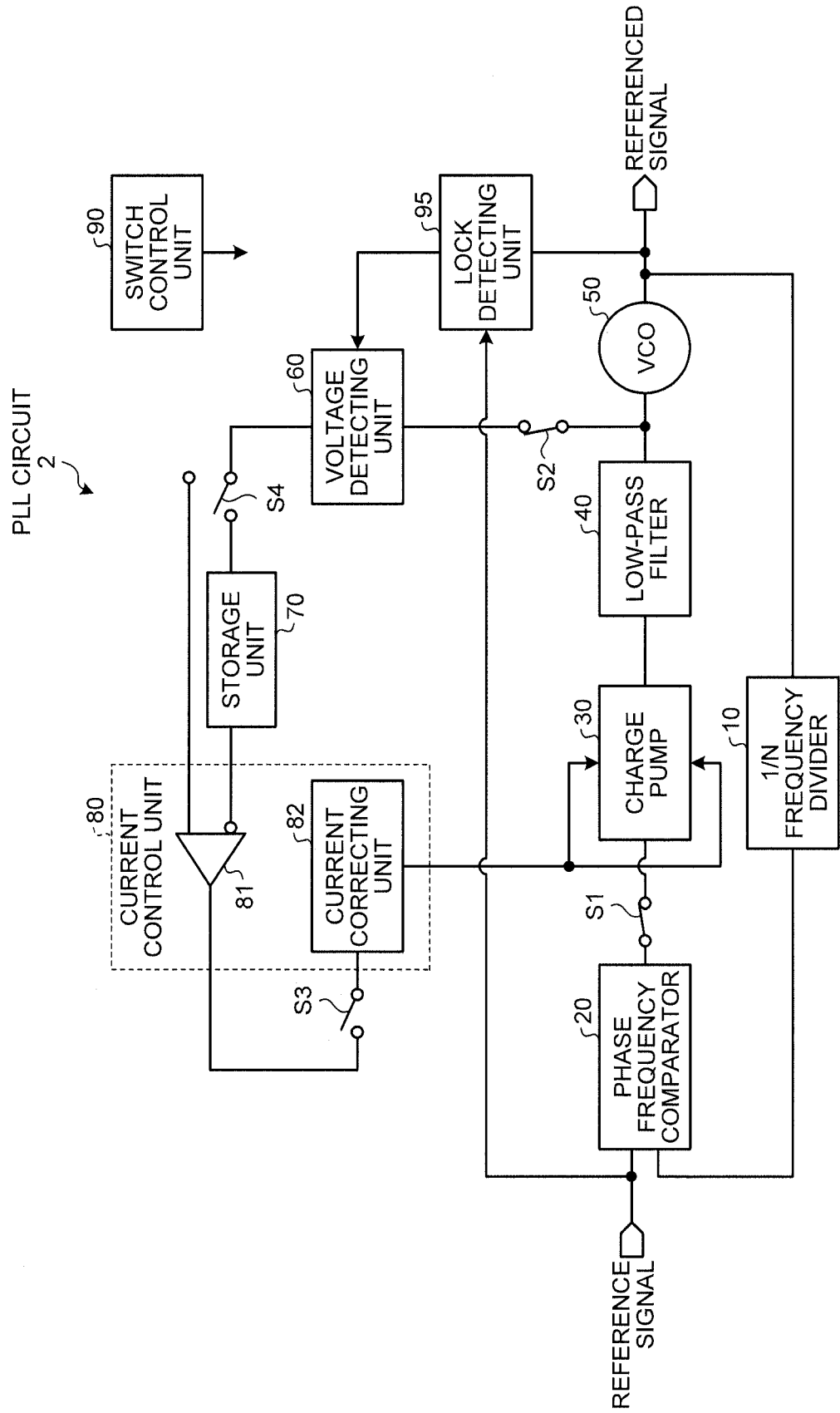
FIG. 2 is a functional block diagram of a configuration of a PLL circuit according to a second embodiment.

FIG. 2 is a functional block diagram of a configuration of a PLL circuit 2 according to the second embodiment. The same components as those of the PLL circuit 1 illustrated in FIG. 1 are denoted by the same reference codes, and the explanation of the same components and operations will not be repeated.

The PLL circuit 2 illustrated in FIG. 2 is different from the PLL circuit 1 illustrated in FIG. 1 in that the current control unit 80 includes a voltage comparing unit 81 and a current correcting unit 82 and the PLL circuit 2 additionally includes various switches S1 to S4, a switch control unit 90 that controls the various switches, and a lock detecting unit 95.

The switch S1 is a switching element that turns ON/OFF a connection between the phase frequency comparator 20 and the charge pump 30, and is controlled by the switch control unit 90. The switch S1 and the switches S2 to S4, which will be described below, are constructed of, for example, MOSFET elements (transistor elements).

The switch S2 is a switching element that turns ON/OFF a connection between the output side of the low-pass filter 40 and the voltage detecting unit 60, and is controlled by the switch control unit 90.

The switch S3 is a switching element that turns ON/OFF a connection between the voltage comparing unit 81 and the current correcting unit 82, and is controlled by the switch control unit 90.

The switch S4 is a switching element that turns ON/OFF a connection between the voltage detecting unit 60 and the storage unit 70, and is controlled by the switch control unit 90. The switch S4 also functions as a switching element that turns ON/OFF a connection between the voltage detecting unit 60 and the voltage comparing unit 81, and is controlled by the switch control unit 90. That is, the switch S4 is used such that the connection between the voltage detecting unit 60 and the voltage comparing unit 81 is turned OFF while the connection between the voltage detecting unit 60 and the storage unit 70 is ON, and the connection between the voltage detecting unit 60 and the voltage comparing unit 81 is turned ON while the connection between the voltage detecting unit 60 and the storage unit 70 is OFF.

The switch control unit 90 turns ON the switch S1 and the switch S2, turns OFF the switch S3, and switches the switch S4 to connect the storage unit 70 side, in order to cause the lock detecting unit 95 to detect the lock-point control voltage when the referenced signal is synchronized with the reference signal.

After the lock-point control voltage is detected, the switch control unit 90 turns OFF the switch S1 in order to cause the current control unit 80 to correct the respective current values of the P channel 31 and the N channel 32 of the charge pump 30. The switch control unit 90 also turns ON the switches S2 and S3 and switches the switch S4 to connect the voltage comparing unit 81 side.

The lock detecting unit 95 is connected to the input side of the phase frequency comparator 20 and the output side of the VCO 50, detects the lock point at which the phases of the reference signal and the referenced signal output from the VCO 50 match each other, and outputs a detection signal indicating that the lock point is detected to the voltage detecting unit 60.

Upon detecting the control voltage at the time of input of the detection signal, the voltage detecting unit 60 stores the control voltage as a lock-point control voltage in the storage unit 70.

The voltage comparing unit 81 compares the control voltage detected by the voltage detecting unit 60 and the lock-point control voltage stored in the storage unit 70, and outputs a comparison result signal to the current correcting unit 82.

The current correcting unit 82 fixes a current value of a pull-up current of the P channel 31 side at the lock point, and increases a current value of a pull-down current of the N channel 32 side such that the current value of the pull-down current matches the current value of the pull-up current to correct the current value of the N channel 32.

For example, when detecting, from the voltage comparing unit 81, a comparison result signal indicating that the control voltage detected by the voltage detecting unit 60 does not match the lock-point control voltage, the current correcting unit 82 increases a reference current value of the pull-down current of the N channel 32 side by one step to correct the current value. The "reference current value" indicates a value of an electric current output from a reference current source, and a simply-described "current value" indicates a value of an electric current flowing through drain.

When detecting a comparison result signal indicating that the control voltage detected by the voltage detecting unit 60 matches the lock-point control voltage, the current correcting unit 82 temporarily maintains the reference current value of the pull-down current of the N channel 32 side.

The current correcting unit 82 then instructs the N channel 32 of the charge pump 30 to use the temporarily-maintained reference current value of the pull-down current when normal operation is performed.

As described above, the current correcting unit 82 fixes the current value of the P channel 31 side at the lock point, and increases the current value of the N channel 32 side to correct the current value of the N channel 32 side. However, the operation is not limited to the above, and the current correcting unit 82 may fix the current value of the N channel 32 side and may decrease the current value of the P channel 31 side to correct the current value of the P channel 31 side.

Figure 3:
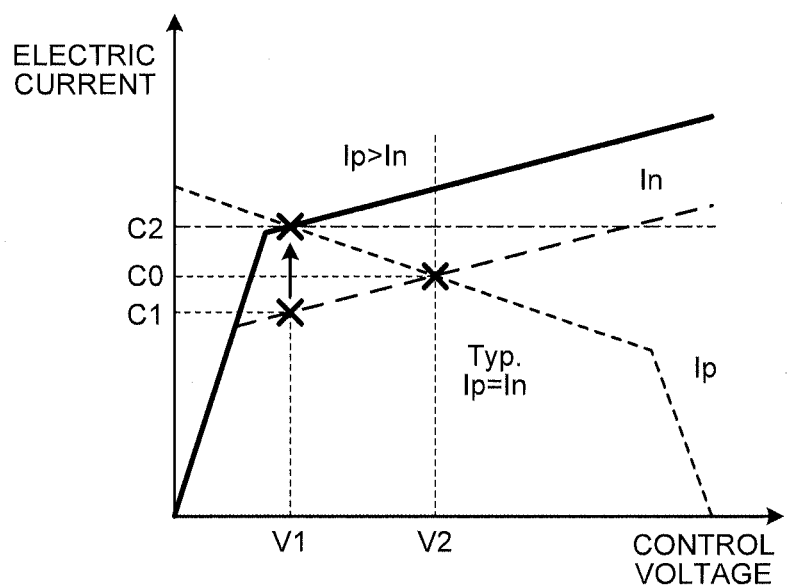
FIG. 3 is a diagram illustrating the principle of the PLL circuit according to the second embodiment.

The principle of the PLL circuit 2 according to the second embodiment will be explained below with reference to FIG. 3. FIG. 3 is a diagram illustrating the principle of the PLL circuit 2 according to the second embodiment.

As illustrated in FIG. 3, the X coordinate represents a value of a "VCO" control voltage and the Y coordinate represents a value of a "drain" current. FIG. 3 indicates that, when the "VCO" control voltage at the lock point varies due to a process variation, respective current values of the "drain" currents output from the P channel 31 and the N channel 32 of the charge pump 30 are deviated from each other.

Specifically, assuming that a control voltage under a typical process condition is represented by V2, the current value Ip of the P channel 31 and the current value In of the N channel 32 match each other at a target design value C0.

However, when the control voltage changes from V2 to V1, the current value Ip of the P channel 31 increases from C0 to C2 and the current value In of the N channel 32 decreases from C0 to C1.

Therefore, the current correcting unit 82 increases the reference current value of the N channel 32 so that the current value C1 is increased to the current value C2 of the P channel, and matches a control voltage that is generated in accordance with a current pulse output from the charge pump 30 with a lock-point control voltage V1. For example, the current correcting unit 82 adjusts a voltage between gate and source by increasing the reference current value of the N channel 32.

When the "VCO" control voltage matches the lock-point control voltage V1, the current value of the N channel 32 matches the current value C2 of the P channel. That is, the characteristics of the N channel 32 change along with a change in the reference current value of the N channel 32, so that the characteristics of the "VCO" control voltage versus the "drain" current of the charge pump 30 are corrected.

Therefore, the PLL circuit 2 can match the current values of respective electric currents output from the P channel 31 and the N channel 32 with each other even when the "VCO" control voltage at the lock point varies due to a process variation. Consequently, the PLL circuit 2 can match the widths and the amplitudes of the current pulses with each other at the lock point. As a result, it becomes possible to reduce the stationary phase difference between the reference signal and the referenced signal, enabling to reduce noise and jitter in the "VCO" control voltage.

Figure 4:
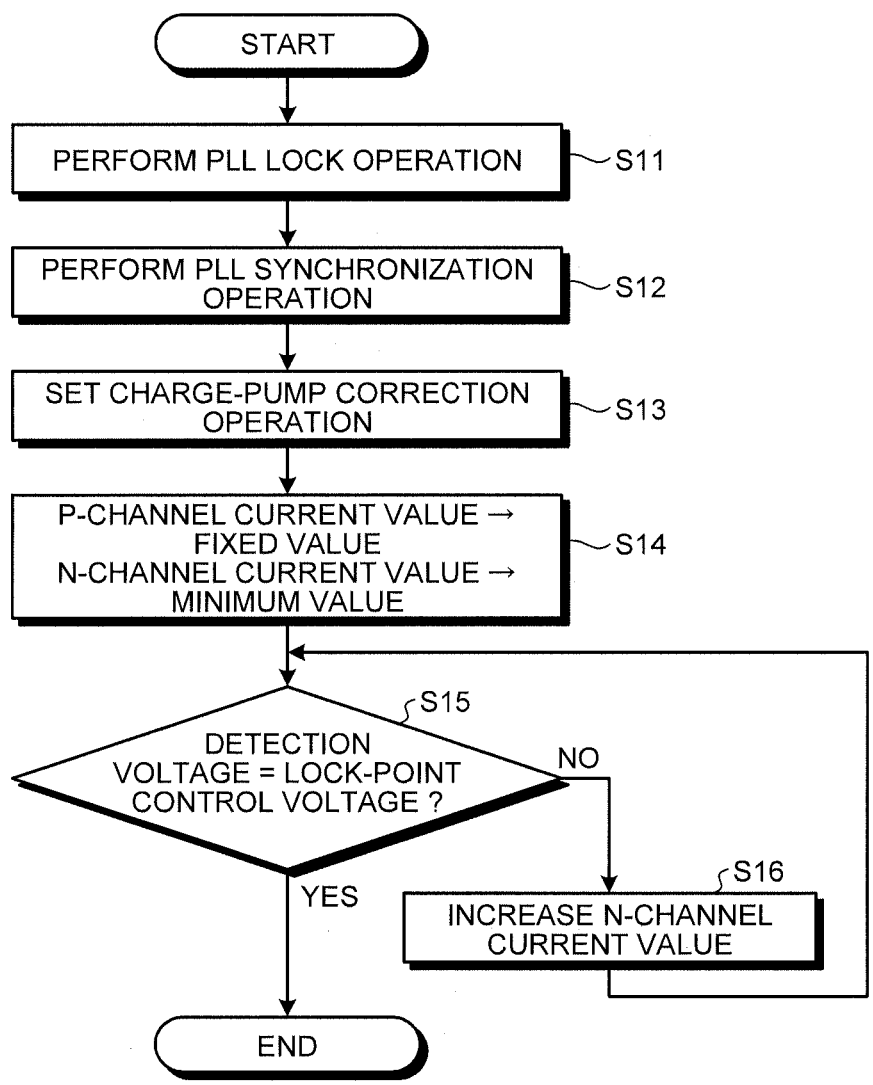
FIG. 4 is a flowchart of a procedure of a process performed by the PLL circuit according to the second embodiment.

A procedure of a process performed by the PLL circuit 2 according to the second embodiment will be explained below with reference to FIG. 4. FIG. 4 is a flowchart of the procedure of the process performed by the PLL circuit 2 according to the second embodiment.

The current correcting unit 82 gives an instruction on a typical reference current value to each of the P channel 31 side and the N channel 32 side (Step S11). At this time, the switch control unit 90 turns ON the switch S1 and the switch S2, turns OFF the switch S3, and switches the switch S4 to turn ON the storage unit 70 side.

The lock detecting unit 95 detects a lock point at which respective phases of the reference signal and the referenced signal output from the VCO 50 match each other, and stores, as the lock-point control voltage, a value of a "VCO" control voltage that is obtained when the voltage detecting unit 60 detects the lock point, in the storage unit 70 (Step S12).

Subsequently, the switch control unit 90 turns OFF the switch S1, turns ON the switches S2 and S3, and switches the switch S4 to turn ON the voltage comparing unit 81 side (Step S13).

The current correcting unit 82 gives an instruction on a typical reference current value to the P channel 31 side in order to fix a current value of the P channel 31 side. The current correcting unit 82 also gives, to the N channel 32, an instruction on a reference current value such that the current value of the pull-down current of the N channel 32 side becomes the minimum value (Step S14).

The voltage comparing unit 81 determines whether or not the control voltage detected by the voltage detecting unit 60 matches the lock-point control voltage stored in the storage unit 70 (Step S15).

When the control voltage detected by the voltage detecting unit 60 does not match the lock-point control voltage (NO at Step S15), the current correcting unit 82 increases the reference current value of the pull-down current of the N channel 32 side by one step in order to increase the current value of the pull-down current of the N channel 32 side (Step S16).

On the other hand, when the control voltage detected by the voltage detecting unit 60 matches the lock-point control voltage (YES at Step S15), the current correcting unit 82 temporarily maintains the reference current value of the pull-down current of the N channel 32 side.

Thereafter, the switch control unit 90 turns ON the switch S1 and turns OFF the switches S2 and S3 in order to cause the PLL circuit 2 to perform normal operation. The current correcting unit 82 gives an instruction on the temporarily-maintained reference current value of the pull-down current to the N channel 32.

As described above, according to the second embodiment, the PLL circuit 2 stores, in the storage unit 70, the lock-point control voltage at the desired frequency that is obtained when the reference signal and the referenced signal are synchronized with each other. Thereafter, the PLL circuit 2 detects an output voltage corresponding to the electric current output from the charge pump 30. Furthermore, the PLL circuit 2 fixes the current value of the P channel 31 at the lock point, and increases the current value of the N channel 32 to the current value of the P channel 31 in order to control the current value of the N channel 32 such that the detected output voltage matches the lock-point control voltage.

With the above configuration, in the PLL circuit 2, the current value of the N channel 32 matches the current value of the P channel 31 when the output voltage that is obtained by increasing the current value of the N channel 32 matches the lock-point control voltage. Therefore, in the PLL circuit 2, current pulse widths and current pulse amplitudes of the respective electric currents match each other at the lock point, so that it becomes possible to reduce the stationary phase difference between the reference signal and the referenced signal.

Furthermore, because the current pulse widths and the current pulse amplitudes of the respective electric currents output from the P channel 31 and the N channel 32 match each other at the lock point in the PLL circuit 2, the PLL circuit 2 can cancel out the electric currents at each timing at which a current pulse rises, so that it is possible to reduce noise in the control voltage.

Moreover, because the PLL circuit 2 can reduce the stationary phase difference, it is possible to reduce a delay time between the reference signal and the referenced signal, enabling to reduce jitter.

[c] Third Embodiment

The PLL circuit 2 according to the second embodiment fixes the current value of the P channel 31 and increases the current value of the N channel 32 to the current value of the P channel 31. Thereafter, the PLL circuit 2 controls the current value of the N channel 32 so that the output voltage detected by the voltage detecting unit 60 matches the lock-point control voltage. Consequently, the current value of the P channel 31 and the current value of the N channel 32 of the charge pump 30 match each other, so that noise in the control voltage can be reduced at the lock point. However, the current values may be deviated from a target design value.

Therefore, a PLL circuit 3 according to a third embodiment increases the current value of each of the P channel 31 and the N channel 32 so that each current value matches the target design value. Thereafter, the PLL circuit 3 controls the current value of each of the P channel 31 and the N channel 32 so that the control voltage detected by the voltage detecting unit 60 matches the lock-point control voltage.

The PLL circuit 3 according to the third embodiment includes a load in such a manner that a lock-point control voltage can be obtained when the current values match the target design value. The PLL circuit 3 controls respective current values of the P channel 31 and the N channel 32 by changing the reference current value of each of the P channel 31 and the N channel 32 so that the output voltage detected by the voltage detecting unit 60 matches the lock-point control voltage.

Figure 5:
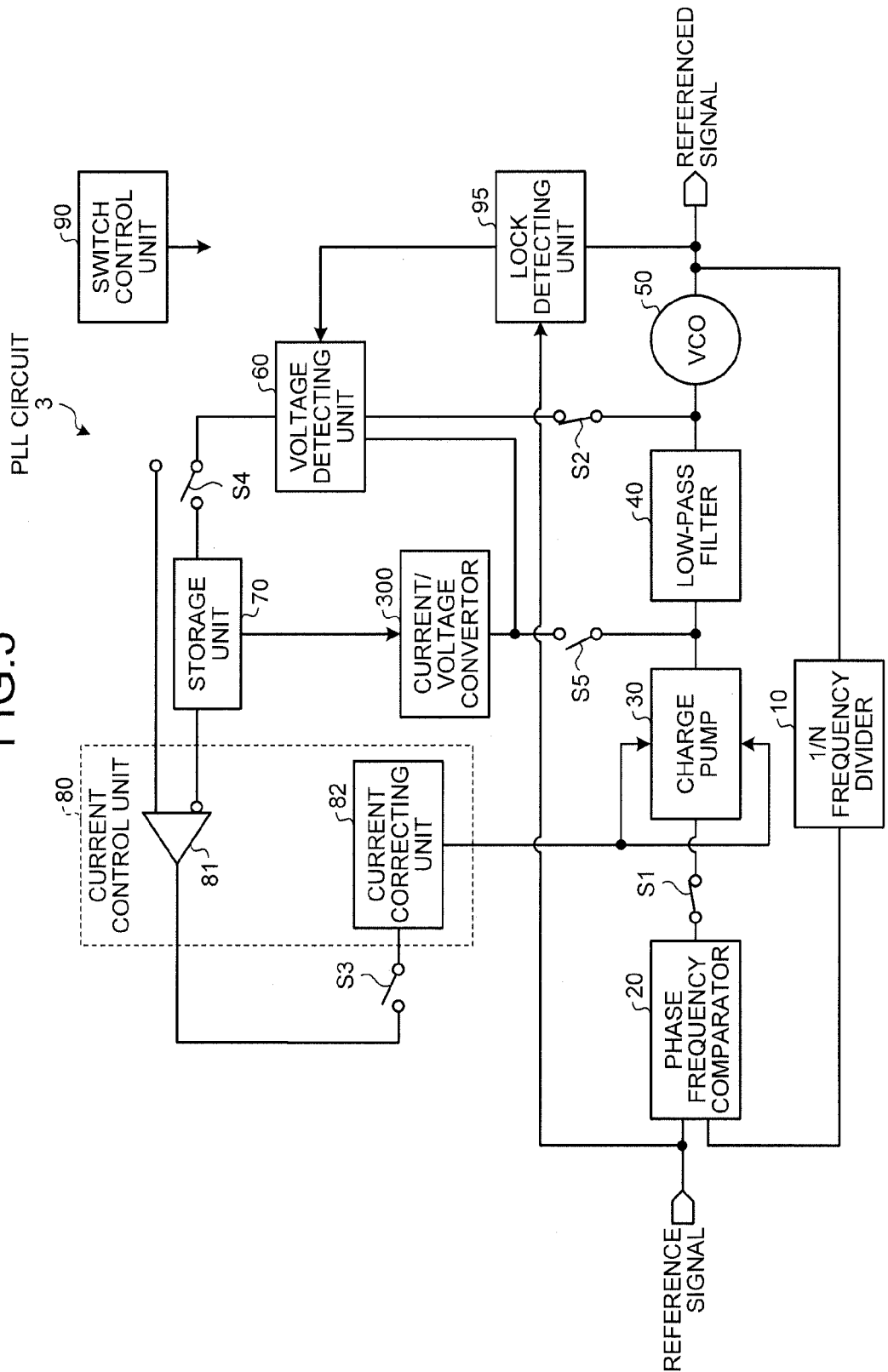
FIG. 5 is a functional block diagram of a configuration of a PLL circuit according to a third embodiment.

FIG. 5 is a functional block diagram of the configuration of the PLL circuit 3 according to the third embodiment. The same components as those of the PLL circuit 2 illustrated in FIG. 2 are denoted by the same reference codes, and explanation of the same components and operations will not be repeated.

The PLL circuit 3 illustrated in FIG. 5 is different from the PLL circuit 2 described in the second embodiment in that the PLL circuit 3 additionally includes a switch S5 and a current/voltage convertor 300.

The switch S5 is a switching element that turns ON/OFF a connection between the output side of the charge pump 30 and the current/voltage convertor 300, and is controlled by the switch control unit 90.

The current/voltage convertor 300 is connected to the switch S5 and converts an electric current output from the charge pump 30 to a voltage when the switch S5 is ON.

Figure 6:
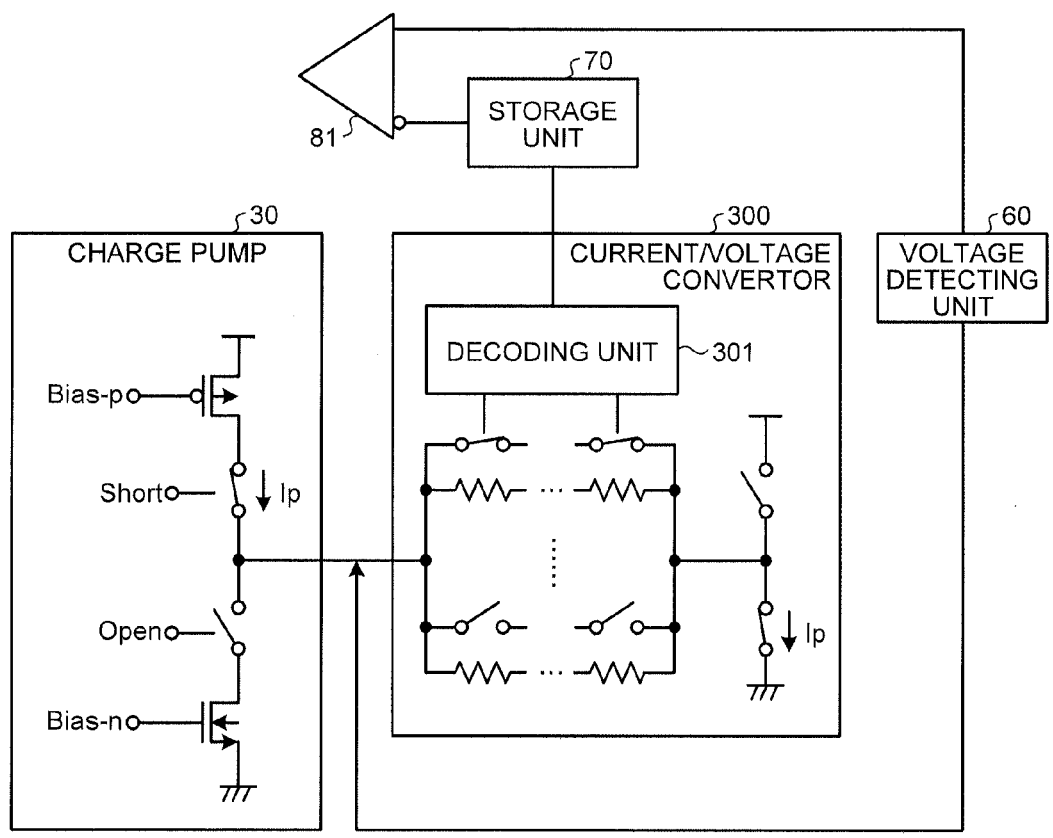
FIG. 6 is a functional block diagram of a configuration of a current/voltage converter according to the third embodiment.

The configuration of the current/voltage convertor 300 will be explained below with reference to FIG. 6. FIG. 6 is a functional block diagram of the configuration of the current/voltage convertor according to the third embodiment. As illustrated in FIG. 3, the current/voltage convertor 300 includes a decoding unit 301 and resistances Rxy (x=1 to m, y=1 to n). The decoding unit 301 of the current/voltage convertor 300 is connected to the storage unit 70 and resistances Rxy, and the resistances Rxy are connected to the charge pump 30.

The decoding unit 301 sets, to the resistances Rxy, resistance values with which the lock-point control voltage can be obtained when the current values match the target design value. For example, the decoding unit 301 sets a resistance value corresponding to the lock-point control voltage stored in the low-pass filter 40, to the resistors Rxy.

Referring back to FIG. 5, the storage unit 70 stores the resistance values with which the lock-point control voltage can be obtained when the current values match the target design value. For example, the storage unit 70 stores in advance a resistance value corresponding to each lock-point control voltage that is obtained when the lock-point control voltage is deviated due to a process variation.

The voltage detecting unit 60 is connected between the charge pump 30 and the current/voltage convertor 300 and detects a voltage that is converted from the electric current by the current/voltage convertor 300.

The current correcting unit 82 increases the current value of the pull-up current of the P channel 31 side from the minimum value to thereby correct the current value of the P channel 31 so that the control voltage detected by the voltage detecting unit 60 matches the lock-point control voltage. At this time, the switches on the N channel 32 side are turned OFF in order to prevent an electric current from the N channel 32 side from being output.

For example, when detecting a comparison result signal indicating that the control voltage detected by the voltage detecting unit 60 does not match the lock-point control voltage, the current correcting unit 82 determines that the current value does not match the target design value, and increases the reference current value of the pull-up current of the P channel 31 side by one step to correct the current value.

When detecting a comparison result signal indicating that the control voltage detected by the voltage detecting unit 60 matches the lock-point control voltage, the current correcting unit 82 determines that the current value matches the target design value, determines a reference current value of the P channel 31 side as the reference current value that corresponds to the detected control voltage, and temporarily maintains the reference current value.

The current correcting unit 82 also determines a reference current value of the pull-down current of the N channel 32 side, similarly to the P channel 31 side, and temporarily maintains the reference current value.

The current correcting unit 82 gives an instruction on the temporarily-maintained reference current value of the pull-up current to the P channel 31 and gives an instruction on the temporarily-maintained reference current value of the pull-down current to the N channel 32, at the time of normal operation.

As described above, the current correcting unit 82 determines the current value of the P channel 31 side and thereafter determines the current value of the N channel 32 side; however, it is not limited thereto. For example, it is possible to determine the current value of the N channel 32 side and thereafter determine the current value of the P channel 31 side.

The current correcting unit 82 determines the reference current value that is obtained when the control voltage detected by the voltage detecting unit 60 matches the lock-point control voltage, by increasing the reference current value of the P channel 31 (or the N channel 32); however, it is not limited thereto. The current correcting unit 82 may calculate and determine the reference current value with which the lock-point control value is obtained, on the basis of the control voltage that is detected as a result of setting the reference current value to the P channel 31 (or the N channel 32).

Figure 7:
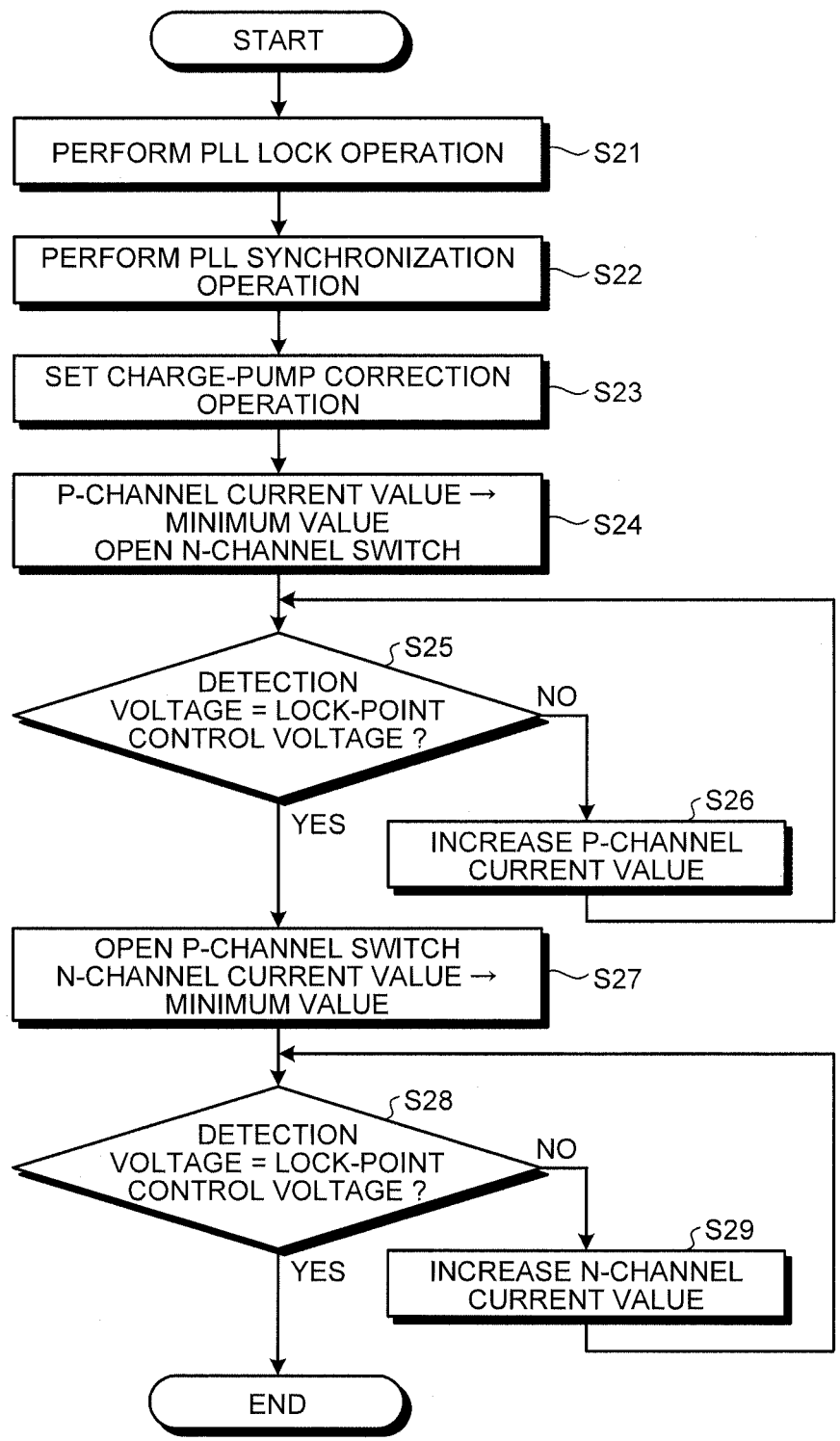
FIG. 7 is a flowchart of a procedure of a process performed by the PLL circuit according to the third embodiment.

A procedure of a process performed by the PLL circuit 3 according to the third embodiment will be explained below with reference to FIG. 7. FIG. 7 is a flowchart of the procedure of the process performed by the PLL circuit 3 according to the third embodiment.

The current correcting unit 82 gives an instruction on a typical reference current value to each of the P channel 31 side and the N channel 32 side (Step S21). At this time, the switch control unit 90 turns ON the switch S1 and switch S2, turns OFF the switch S3 and the switch S5, and switches the switch S4 to turn ON the storage unit 70 side.

The lock detecting unit 95 detects a lock point at which the phases of the reference signal and the referenced signal output form the VCO 50 match each other, and stores, as the lock-point control voltage, a value of a "VCO" control voltage that is obtained when the voltage detecting unit 60 detects the lock point, in the storage unit 70 (Step S22).

Subsequently, the switch control unit 90 turns OFF the switch S1, turns ON the switches S2, S3, and S5, and switches the switch S4 to turn ON the voltage comparing unit 81 side, in order to cause the current control unit 80 to correct the respective current values of the P channel 31 and the N channel 32 (Step S23).

The current correcting unit 82 turns OFF the switches on the N channel 32 side in order to prevent flowing-in of an electric current from the N channel 32 side. On the other hand, the current correcting unit 82 turns ON the switches on the P channel 31 side and gives, to the P channel 31, an instruction on a reference current value such that the current value of the pull-up current of the P channel 31 side becomes the minimum value (Step S24).

The voltage comparing unit 81 determines whether or not the control voltage detected by the voltage detecting unit 60 matches the lock-point control voltage stored in the storage unit 70 (Step S25).

When the control voltage detected by the voltage detecting unit 60 does not match the lock-point control voltage (NO at Step S25), the current correcting unit 82 determines that the current value does not match the target design value and increases the reference current value of the pull-up current of the P channel 31 side by one step in order to increase the current value of the pull-up current of the P channel side (Step S26).

On the other hand, when the control voltage detected by the voltage detecting unit 60 matches the lock-point control voltage (YES at Step S25), the current correcting unit 82 determines that the current value matches the target design value and temporarily maintains the reference current value of the pull-up current of the P channel 31 side.

Subsequently, the current correcting unit 82 turns OFF the switches on the P channel 31 side in order to prevent flowing-in of an electric current from the P channel 31 side. On the other hand, the current correcting unit 82 turns ON the switches on the N channel 32 side and gives, to the N channel 32, an instruction on a reference current value such that the current value on the pull-down current of the N channel 32 side becomes the minimum value (Step S27).

The voltage comparing unit 81 determines whether or not the control voltage detected by the voltage detecting unit 60 matches the lock-point control voltage stored in the storage unit 70 (Step S28).

When the control voltage detected by the voltage detecting unit 60 does not match the lock-point control voltage (NO at Step S28), the current correcting unit 82 determines that the current value does not match the target design value and increases the reference current value of the pull-down current of the N channel 32 side by one step in order to increase the current value of the pull-down current of the N channel 32 side (Step S29).

On the other hand, when the control voltage detected by the voltage detecting unit 60 matches the lock-point control voltage (YES at Step S28), the current correcting unit 82 determines that the current value matches the target design value and temporarily maintains the reference current value of the pull-down current of the N channel 32 side.

Thereafter, the switch control unit 90 turns ON the switch S1 and turns OFF the switches S2 to S5 in order to cause the PLL circuit 3 to perform normal operation. The current correcting unit 82 also gives an instruction on the temporarily-maintained reference current value of the pull-up current and the temporarily-maintained reference current value of the pull-down current to the P channel 31 and the N channel 32, respectively.

As described above, according to the third embodiment, the PLL circuit 3 stores; in the storage unit 70, the lock-point control voltage at the desired frequency that is obtained when the reference signal and the referenced signal are synchronized with each other. The PLL circuit 3 includes the current/voltage convertor 300 on which a resistance value, with which the lock-point control voltage can be obtained when the current value matches the target design value, is set. The PLL circuit 3 also controls the current value of each of the P channel 31 and the N channel 32 so that the control voltage detected by the voltage detecting unit 60 matches the lock-point control voltage, by increasing the current value of each of the P channel 31 and the N channel 32 so that the current values match the target design value.

With this configuration, in the PLL circuit 3, the respective current values of the P channel 31 and the N channel 32 match the target design value when the output voltage, which is obtained by increasing the current values of the P channel 31 and the N channel 32, matches the lock-point control voltage.

Therefore, the PLL circuit 3 can adjust the current values to the target design value, so that it becomes possible to more stably perform the operation of synchronizing the phase of the referenced signal with the phase of the reference signal.

Furthermore, in the PLL circuit 3, the current value of the P channel 31 and the current value of the N channel 32 match each other at the target design value when the output voltage, which is obtained by increasing the respective current values of the P channel 31 and the N channel 32, matches the lock-point control voltage. Therefore, the PLL circuit 3 can match the current pulse widths and the current pulse amplitudes of respective electric currents with each other at the lock point, so that it becomes possible to reduce the stationary phase difference between the reference signal and the referenced signal.

Moreover, because the current pulse widths and the current pulse amplitudes of the respective electric currents output from the P channel 31 and the N channel 32 match each other at the lock point in the PLL circuit 3, it becomes possible to cancel out the electric currents at each timing at which a current pulse rises, enabling to reduce noise in the control voltage.

Furthermore, because the PLL circuit 3 can reduce the stationary phase differenced, it is possible to reduce a delay time between the reference signal and the referenced signal, enabling to reduce jitter.

[d] Fourth Embodiment

The PLL circuit 1 according to the first embodiment changes at least one of the current values of the P channel 31 and the N channel 32 so that the current values match each other. Thereafter, the PLL circuit 1 controls the current value of each of the P channel 31 and the N channel 32 so that the control voltage detected by the voltage detecting unit 60 matches the lock-point control voltage. However, the PLL circuit 1 is not limited to the above, and a function of controlling the current value of each of the P channel 31 and the N channel 32 can be used to reduce a data error rate.

A PLL circuit 4 according to a fourth embodiment will be explained below that uses the function of controlling the current value of each of the P channel 31 and the N channel 32 in order to reduce the data error rate.

Figure 8:
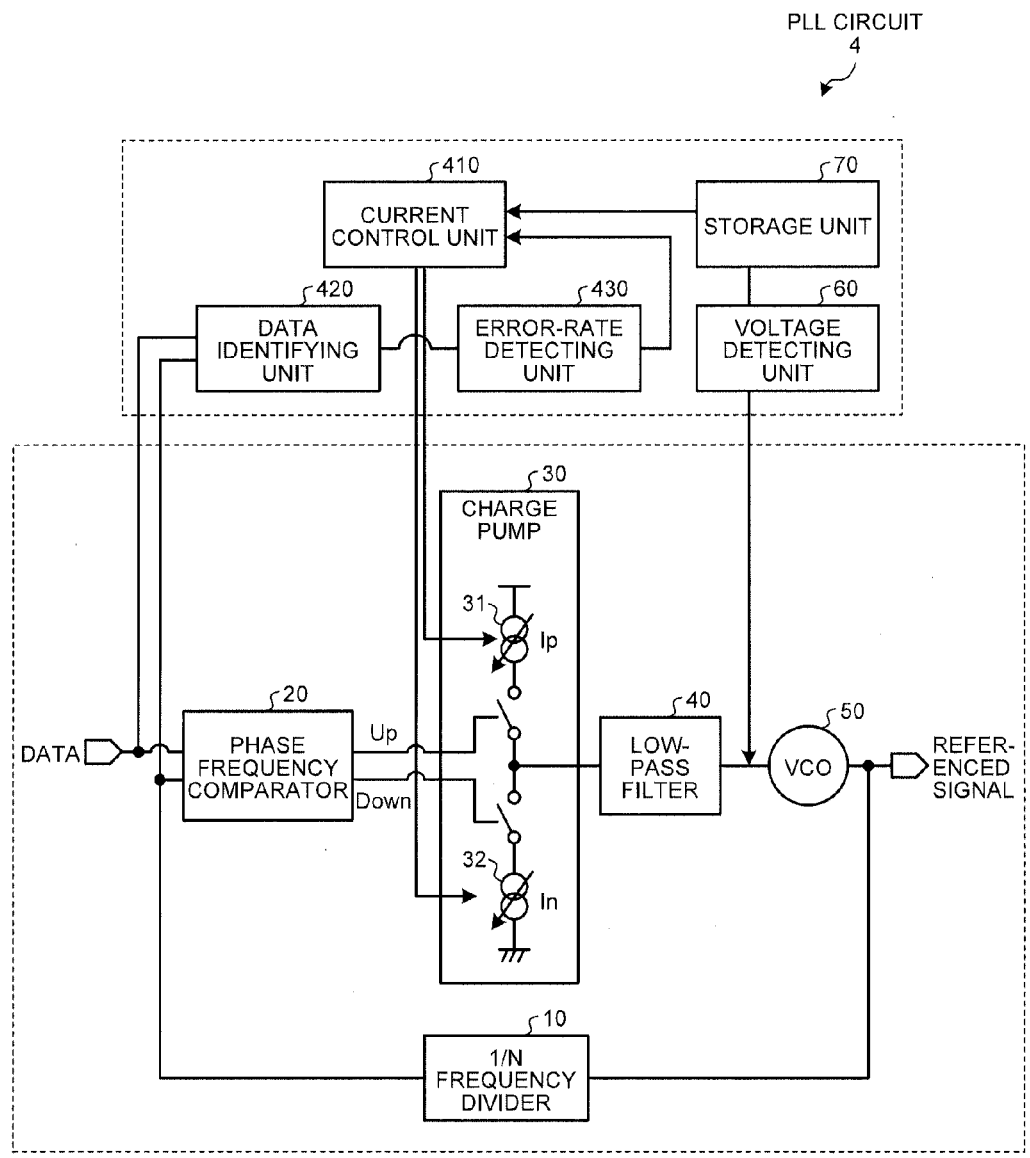
FIG. 8 is a functional block diagram of a configuration of a PLL circuit according to a fourth embodiment.

FIG. 8 is a functional block diagram of the configuration of the PLL circuit 4 according to the fourth embodiment. The same components as those of the PLL circuit 1 illustrated in FIG. 1 are denoted by the same reference codes, and explanation of the same component and operations will not be repeated.

The PLL circuit 4 illustrated in FIG. 8 is different from the PLL circuit 1 illustrated in FIG. 1 in that the PLL circuit 4 includes an current control unit 410 and additionally includes a data identifying unit 420 and an error-rate detecting unit 430.

The current control unit 410 controls the current value of each of the P channel 31 and the N channel 32 so that a data error rate can be reduced. Specifically, the current control unit 410 fixes the current value of at least one of the P channel 31 and the N channel 32 to a current value at the lock point, and increases the current value of the other one of the P channel 31 and the N channel 32 from the minimum value.

The current control unit 410 instructs the P channel 31 and the N channel 32 to use the reference current value corresponding to a current value that is obtained when the error rate detected by the error-rate detecting unit 430, which will be described below, is the smallest.

The data identifying unit 420 determines whether or not data that is input to the phase frequency comparator 20 can be identified by using the referenced signal while the current control unit 410 is controlling the respective electric currents from the P channel 31 and the N channel 32 of the charge pump 30. It is assumed that the referenced signal is a clock signal for identifying data. The data identifying unit 420 outputs success or failure of data identification, as a result of the determination, to the error-rate detecting unit 430.

The error-rate detecting unit 430 detects an error rate, on the basis of the success or failure of the data identification output from the data identifying unit 420. For example, the error-rate detecting unit 430 detects an error rate in accordance with the success or failure of a predetermined number of data identifications with respect to the same current value of the P channel 31 (or the N channel 32) controlled by the current control unit 410. The predetermined number is found out by, for example, experiments in advance, and information on the predetermined number is stored in the storage unit 70.

Figure 9:
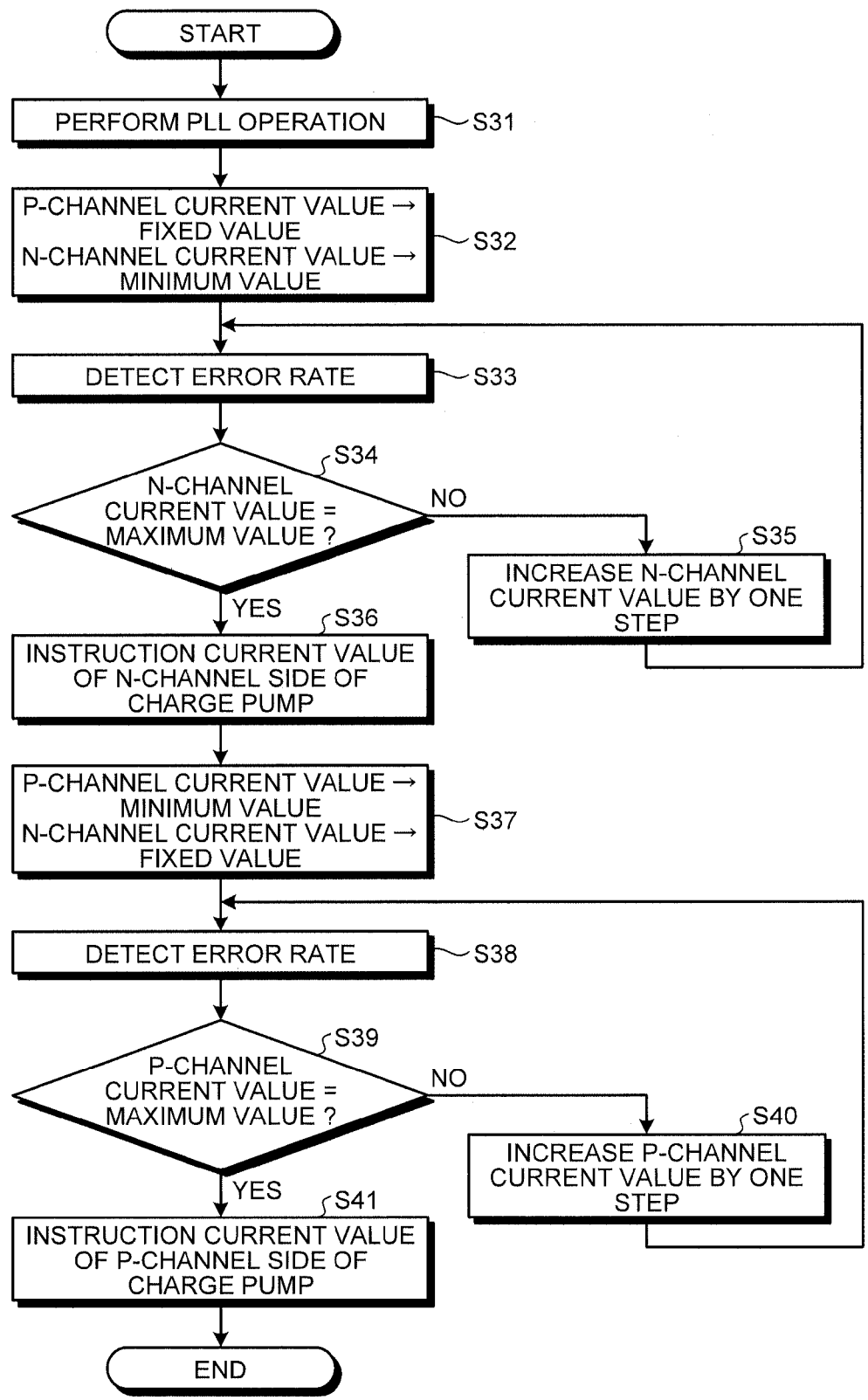
FIG. 9 is a flowchart of a procedure of a process performed by the PLL circuit according to the fourth embodiment.
Figure 10:
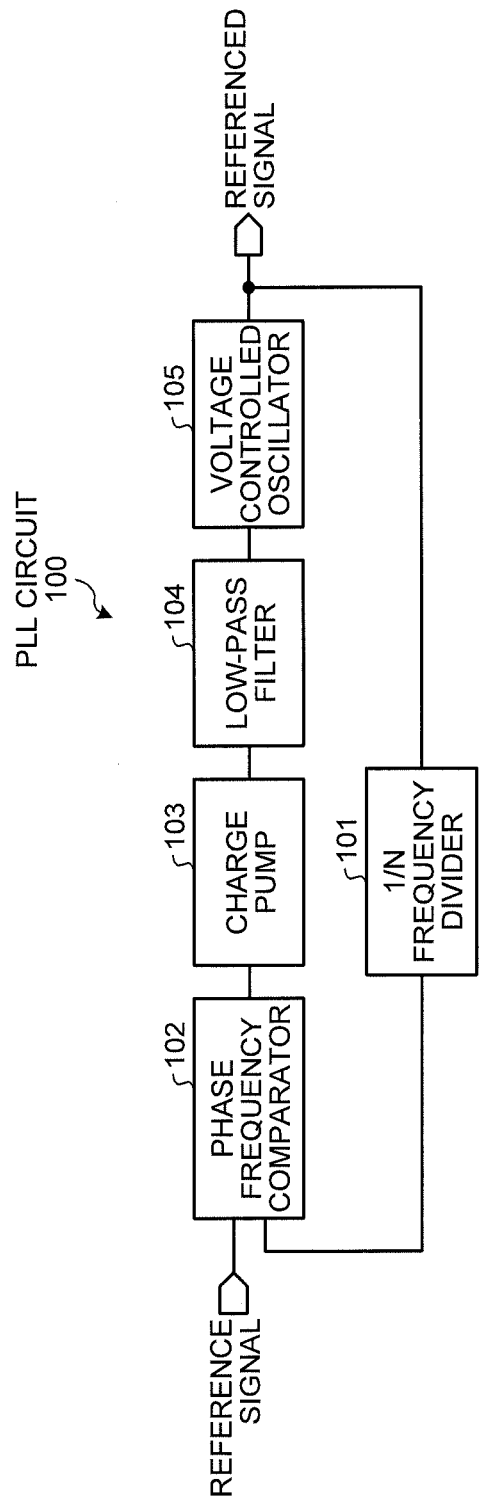
FIG. 10 is a block diagram of a schematic configuration of the interior of a conventional PLL circuit.
Figure 11:
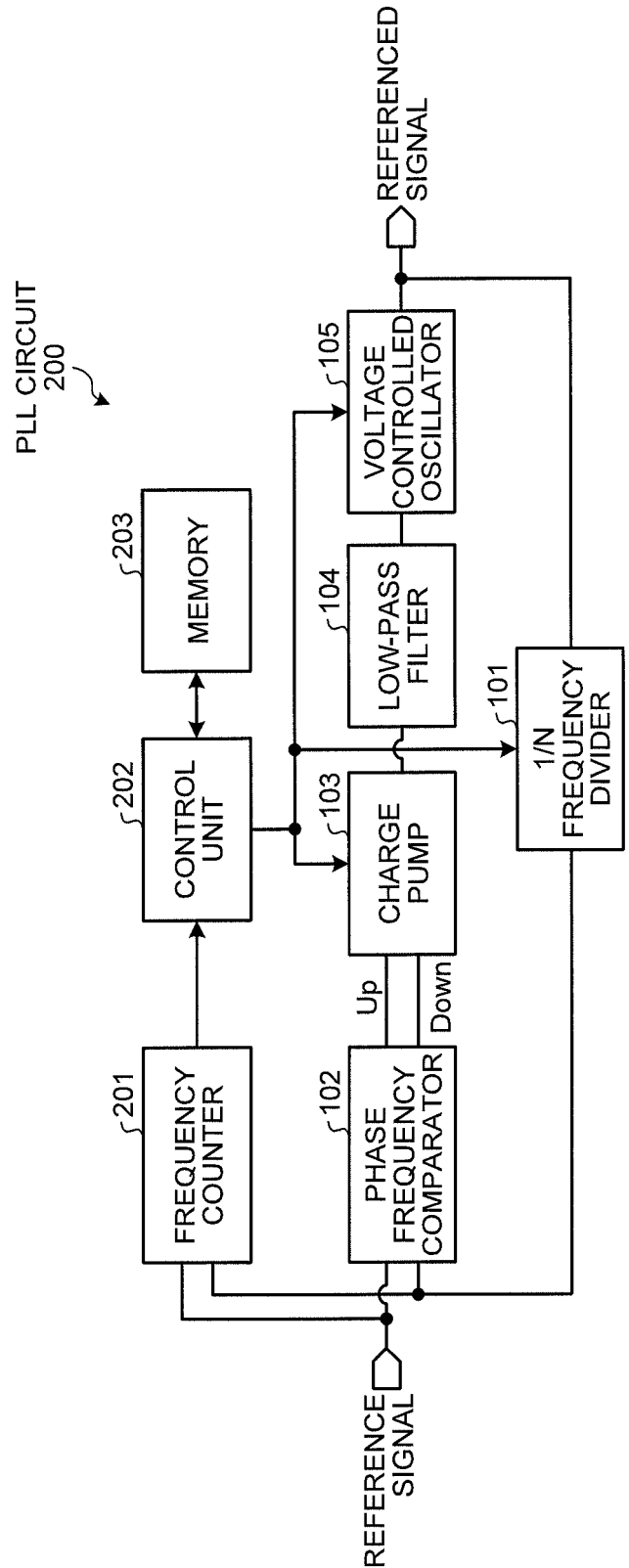
FIG. 11 is a block diagram of the schematic configuration of the interior of the conventional PLL circuit.
Figure 12A:
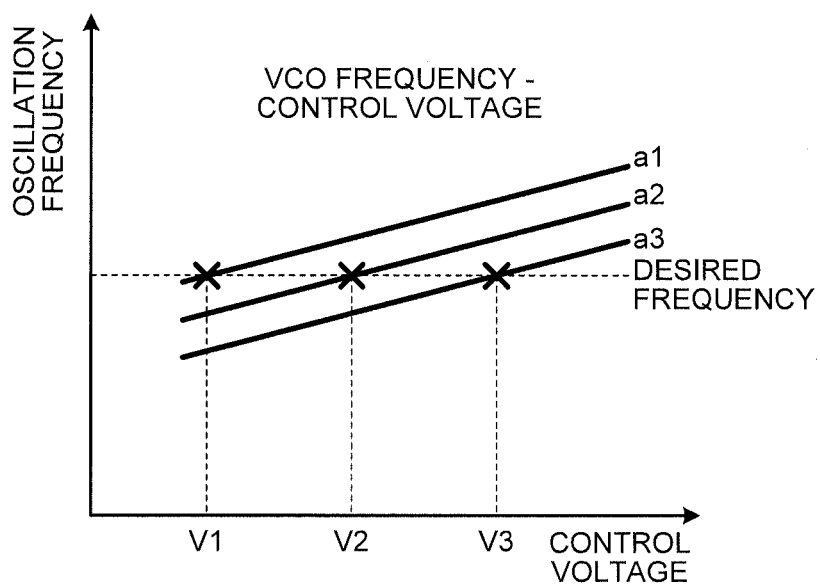
FIG. 12A is a diagram illustrating oscillation frequency-control voltage characteristics of a VCO.
Figure 12B:
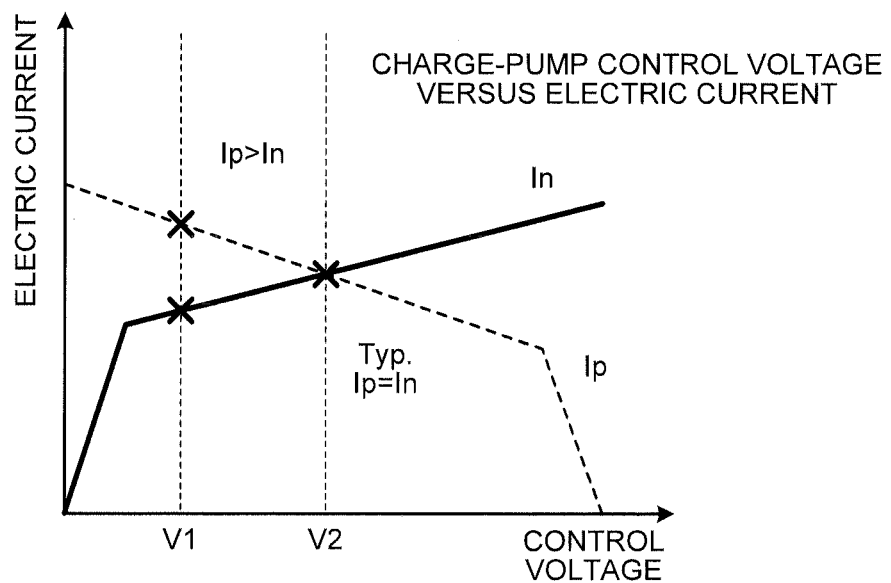
FIG. 12B is a diagram illustrating current-control voltage characteristics of a charge pump.
Figure 13:
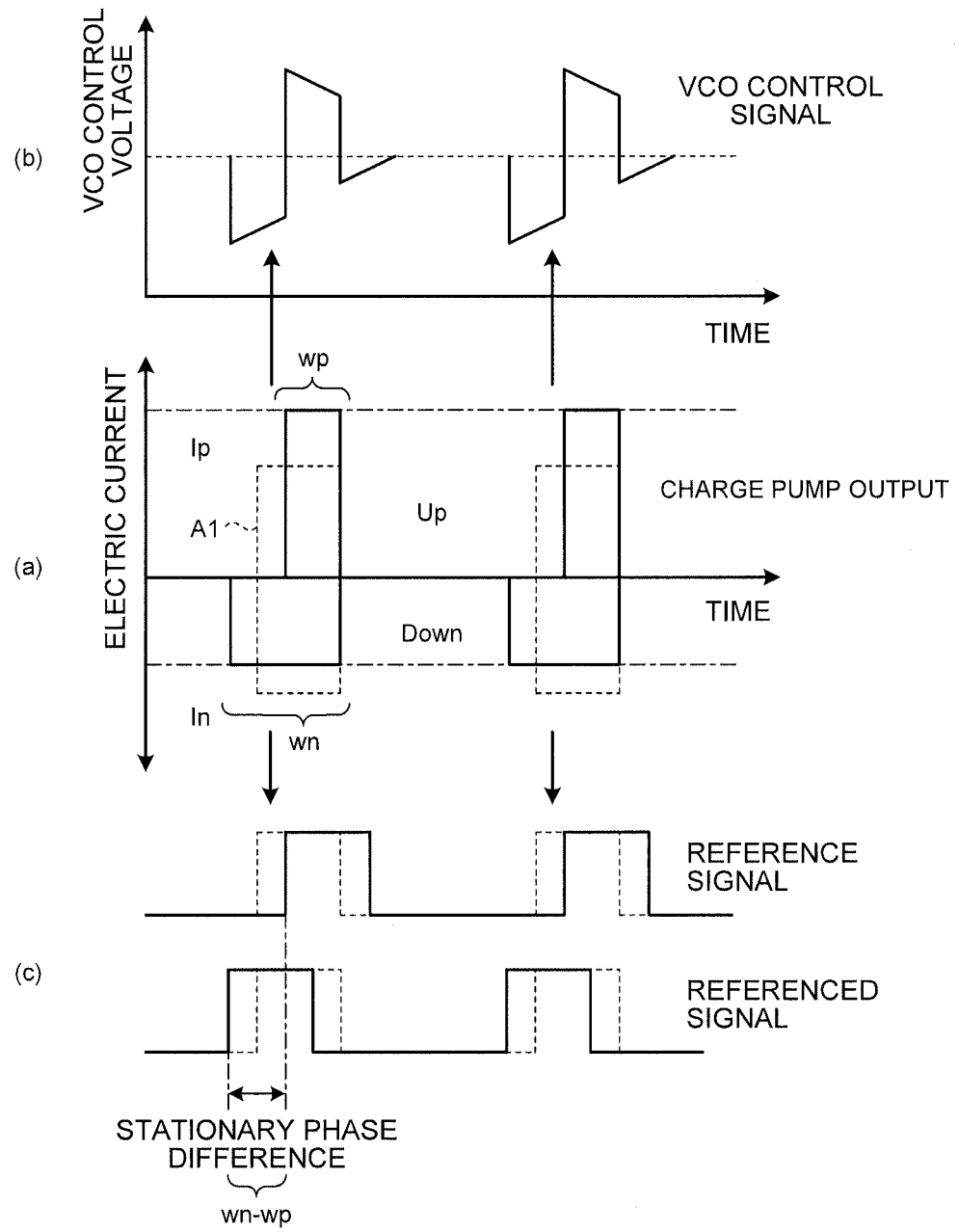
FIG. 13 includes a diagram (a), a diagram (b) and a diagram (c).

A procedure of a process performed by the PLL circuit 4 according to the fourth embodiment will be explained below with reference to FIG. 9. FIG. 9 is a flowchart of the procedure of the process performed by the PLL circuit 4 according to the fourth embodiment.

The current control unit 410 gives an instruction on a typical reference current value to each of the P channel 31 side and the N channel 32 side (Step S31).

The current control unit 410 gives, to the P channel 31 side, an instruction on a typical reference current value in order to fix the current value of the P channel 31 side. On the other hand, the current control unit 410 gives, to the N channel 32, an instruction on a reference current value such that the current value of the pull-down current of the N channel 32 side becomes the minimum value (Step S32).

The error-rate detecting unit 430 detects an error rate on the basis of success or failure of data identification performed by the data identifying unit 420 (Step S33).

The current control unit 410 determines whether or not the current value of the pull-down current of the N channel 32 side is the maximum value (Step S34).

When it is determined that the current value of the pull-down current of the N channel 32 side is not the maximum value (NO at Step S34), the current control unit 410 increases the current value of the pull-down current of the N channel 32 side by one step (Step S35), and the process returns to Step S33.

When it is determined that the current value of the pull-down current on the N channel 32 side is the maximum value (YES at Step S34), the current control unit 410 gives, to the N channel 32 of the charge pump 30, an instruction on a reference current value of the pull-down current such that the error rate becomes the minimum value (Step S36).

Subsequently, the current control unit 410 gives, to the P channel 31, an instruction on a reference current value such that the current value of the P channel 31 side becomes the minimum value. The current control unit 410 fixes the current value of the N channel 32 side to the reference current value of the pull-down current so that the error rate becomes the minimum value (Step S37).

The error-rate detecting unit 430 detects an error rate on the basis of success or failure of data identification performed by the data identifying unit 420 (Step S38).

The current control unit 410 further determines whether the current value of the pull-up current of the P channel 31 side is the maximum value or not (Step S39).

When it is determined that the current value of the pull-up current of the P channel 31 side is not the maximum value (NO at Step S39), the current control unit 410 increase the current value of the pull-up current of the P channel 31 side by one step (Step S40), and the process returns to Step S38.

When it is determined that the current value of the pull-up current of the P channel 31 side is the maximum value (YES at Step S39), the current control unit 410 gives, to the P channel 31 of the charge pump 30, an instruction on a reference current value of the pull-up current such that the error rate becomes the minimum value (Step S41).

As described above, according to the fourth embodiment, the PLL circuit 4 fixes the current value of one of the P channel 31 and the N channel 32 at the lock point so that a data error rate is minimized, and controls the current value of the other one of the P channel 31 and the N channel 32 by increasing the current value of the other one of the P channel 31 and the N channel 32. The PLL circuit 4 also fixes and sets the current value that is obtained when the data error rate is the minimum value to the other channel, and increases the current value of one of the channels to controls the current value of this channel.

With this configuration, the PLL circuit 4 controls the current value of each of the P channel 31 and the N channel 32 so that the data error rate is minimized. Therefore, the PLL circuit 4 can perform adjustment to reduce the stationary phase difference even when the stationary phase difference between data and a referenced signal occurs due to a process variation.

In the embodiments, the current control unit 80 adjusts respective current values of the P channel 31 and the N channel 32 of the charge pump 30 after the switch S1 is turned OFF. However, the embodiments are not limited to the above. The current control unit 80 may perform adjustment by using the up signal and the down signal having the same pulse widths that are output from the phase frequency comparator 20 while the switch S1 is ON.

The embodiments of the present invention are described above. However, the scope of the technical concepts of the present invention is not limited to the embodiments shown and described herein. Accordingly, various modifications may be made without departing from the spirit or scope of the general inventive concept as defined by the appended claims and their equivalents. Furthermore, the advantageous effects described in the embodiments are not limited by those described herein.

Among the processes described in the embodiments, all or some of the processes that are automatically performed in the above explanation may be performed manually, or, all or some of the processes that are manually performed in the above explanation may be performed automatically. Furthermore, the process procedures, the control procedures, the specific names, and the information including various types of data and parameters as described in the embodiments may be arbitrarily changed unless otherwise noted.

The components of the PLL circuits 1 to 4 illustrated in the drawings are based on functional concepts. The components do not necessarily have to be physically arranged in the way illustrated in the drawings. In other words, the specific mode of the PLL circuits 1 to 4 is not limited to the ones illustrated in the drawing.

All or any of the processing functions performed by each of the apparatuses and devices can be implemented by a Central Processing Unit (CPU) (or a microcomputer, such as a Micro Processing Unit (MPU) or a Micro Controller Unit (MCU)) and programs analyzed and executed by the CPU (or the microcomputer, such as the MPU or the MCU) or implemented as wired logic hardware.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An oscillator circuit comprising:
   a storage unit that stores therein a control voltage at a desired frequency that is obtained when a reference signal and a referenced signal are synchronized with each other;
   a current generator circuit that includes
      a pull-up circuit that flows out an electric current at a predetermined timing; and
      a pull-down circuit that draws an electric current at a predetermined timing;
   a voltage detecting unit that detects an output voltage corresponding to an electric current output by the current generator circuit; and
   a current control unit that changes a current value of at least one of the pull-up circuit and the pull-down circuit so that respective current values of the pull-up circuit and the pull-down circuit match each other, and controls the respective current values of the pull-up circuit and the pull-down circuit so that the output voltage detected by the voltage detecting unit matches the control voltage stored in the storage unit.

2. The oscillator circuit according to claim 1, wherein
   the current control unit fixes a current value of the pull-up circuit at the time the reference signal and the referenced signal are synchronized with each other, and increases a current value of the pull-down circuit to correct the current-value of the pull-down circuit.

3. The oscillator circuit according to claim 1, wherein
   the current control unit fixes a current value of the pull-down circuit at the time the reference signal and the referenced signal are synchronized with each other, and decreases a current value of the pull-up circuit to correct the current-value of the pull-up circuit.

4. The oscillator circuit according to claim 1, further comprising:
   a voltage converting unit that converts an electric current output by the current generator circuit to a voltage, wherein
   the voltage detecting unit detects the voltage converted by the voltage converting unit, and
   the current control unit changes the current value of the pull-up circuit and the current value of the pull-down circuit so that the respective current values of the pull-up circuit and the pull-down circuit match a predetermined design value, and controls the respective current values of the pull-up circuit and the pull-down circuit.

5. The oscillator circuit according to claim 4, wherein
   the voltage converting unit sets a resistance value so that the control voltage stored in the storage unit is obtained when the current values of respective electric currents output from the pull-up circuit and the pull-down circuit match the design value.

6. The oscillator circuit according to claim 2, wherein
   the current control unit includes
      a voltage determining unit that determines whether or not the output voltage detected by the voltage detecting unit matches the control voltage stored in the storage unit; and a current correcting unit that corrects, when the output voltage detected by the voltage detecting unit does not match the control voltage stored in the storage unit, a reference current value of one of the pull-up circuit and the pull-down circuit for which an electric current is changed, on the basis of a determination result obtained by the voltage determining unit.

7. The oscillator circuit according to claim 3, wherein the current control unit includes
   a voltage determining unit that determines whether or not the output voltage detected by the voltage detecting unit matches the control voltage stored in the storage unit; and
   a current correcting unit that corrects, when the output voltage detected by the voltage detecting unit does not match the control voltage stored in the storage unit, a reference current value of one of the pull-up circuit and the pull-down circuit for which an electric current is changed, on the basis of a determination result obtained by the voltage determining unit.

8. The oscillator circuit according to claim 4, wherein the current control unit includes
   a voltage determining unit that determines whether or not the output voltage detected by the voltage detecting unit matches the control voltage stored in the storage unit; and
   a current correcting unit that corrects, when the output voltage detected by the voltage detecting unit does not match the control voltage stored in the storage unit, a reference current value of one of the pull-up circuit and the pull-down circuit for which an electric current is changed, on the basis of a determination result obtained by the voltage determining unit.

9. The oscillator circuit according to claim 2, wherein the current control unit includes
   a voltage determining unit that determines whether or not the output voltage detected by the voltage detecting unit matches the control voltage stored in the storage unit; and
   a current correcting unit that corrects, when the output voltage detected by the voltage detecting unit matches the control voltage stored in the storage unit, a reference current value of one of the pull-up circuit and the pull-down circuit for which an electric current is changed, to a reference current value corresponding to the output voltage, on the basis of a determination result obtained by the voltage determining unit.

10. The oscillator circuit according to claim 3, wherein the current control unit includes
    a voltage determining unit that determines whether or not the output voltage detected by the voltage detecting unit matches the control voltage stored in the storage unit; and
    a current correcting unit that corrects, when the output voltage detected by the voltage detecting unit matches the control voltage stored in the storage unit, a reference current value of one of the pull-up circuit and the pull-down circuit for which an electric current is changed, to a reference current value corresponding to the output voltage, on the basis of a determination result obtained by the voltage determining unit.

11. The oscillator circuit according to claim 4, wherein the current control unit includes
    a voltage determining unit that determines whether or not the output voltage detected by the voltage detecting unit matches the control voltage stored in the storage unit; and
    a current correcting unit that corrects, when the output voltage detected by the voltage detecting unit matches the control voltage stored in the storage unit, a reference current value of one of the pull-up circuit and the pull-down circuit for which an electric current is changed, to a reference current value corresponding to the output voltage, on the basis of a determination result obtained by the voltage determining unit.

12. The oscillator circuit according to claim 1, wherein the current generator circuit receives input of a first pulse signal and a second pulse signal, both of which have the same pulse widths, outputs an electric current through the pull-up circuit in accordance with the first pulse signal, and outputs an electric current through the pull-down circuit in accordance with the second pulse signal.

13. The oscillator circuit according to claim 1, further comprising:
    an identification-failure-probability detecting unit that detects a probability that data superimposed on the reference signal is not identified by the referenced signal after the control unit has controlled the respective current values of the pull-up circuit and the pull-down circuit, wherein
    the current control unit controls a current value corresponding to a minimum probability among probabilities detected by the identification-failure-probability detecting unit.

14. The oscillator circuit according to claim 9, wherein the referenced signal is a clock for identifying data.

15. An electric-current correction method comprising:
    detecting an output voltage corresponding to an electric current that is output by a current generator circuit, the current generator circuit including:
       a pull-up circuit that flows out an electric current at a predetermined timing; and
       a pull-down circuit that draws an electric current at a predetermined timing; and
    changing a current value of at least one of the pull-up circuit and the pull-down circuit so that respective current values of the pull-up circuit and the pull-down circuit match each other, and controlling the respective current values of the pull-up circuit and the pull-down circuit so that the output voltage detected at the detecting matches the control voltage stored by a storage unit storing a control voltage at a desired frequency that is obtained when a reference signal and a referenced signal are synchronized with each other.

* * * * *

UNITED STATES PATENT AND TRADEMARK OFFICE
CERTIFICATE OF CORRECTION

PATENT NO. : 8,451,065 B2
APPLICATION NO. : 13/333473
DATED : May 28, 2013
INVENTOR(S) : Kouichi Suzuki et al.

Page 1 of 1

It is certified that error appears in the above-identified patent and that said Letters Patent is hereby corrected as shown below:

Title page Col. 1(Related U.S. Application Data), Line 2, Delete "PCT/CT2009/061881" and insert -- PCT/JP2009/061881 --, therefor.

Signed and Sealed this
Seventeenth Day of September, 2013

Teresa Stanek Rea
*Deputy Director of the United States Patent and Trademark Office*